(12) United States Patent
Guo et al.

(10) Patent No.: US 10,573,696 B2
(45) Date of Patent: Feb. 25, 2020

(54) DISPLAY PANEL, DISPLAY DEVICE, AND MANUFACTURING METHOD AND DRIVING METHOD OF DISPLAY PANEL

(71) Applicants: Beijing BOE Display Technology Co., Ltd., Beijing (CN); BOE Technology Group Co., Ltd., Beijing (CN)

(72) Inventors: Rui Guo, Beijing (CN); Weihao Hu, Beijing (CN); Boxiao Lan, Beijing (CN); Zhiming Meng, Beijing (CN); Hengyu Yan, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/048,404

(22) Filed: Jul. 30, 2018

(65) Prior Publication Data

US 2019/0148466 A1 May 16, 2019

(30) Foreign Application Priority Data

Nov. 10, 2017 (CN) .......................... 2017 1 1106551

(51) Int. Cl.
*H01L 27/32* (2006.01)
*G02F 1/1343* (2006.01)
(Continued)

(52) U.S. Cl.
CPC .... *H01L 27/3232* (2013.01); *G02F 1/134309* (2013.01); *G09G 3/3208* (2013.01);
(Continued)

(58) Field of Classification Search
CPC ............. H01L 27/3232; H01L 27/3267; H01L 51/5206; H01L 51/56; G09G 3/36; G02F 1/134309
(Continued)

(56) References Cited

U.S. PATENT DOCUMENTS 7,548,023 B2 * 6/2009 Yamazaki ........... H01L 51/0003
313/505
8,900,970 B2 * 12/2014 Maruyama ....... G06K 19/07749
438/458

(Continued)

FOREIGN PATENT DOCUMENTS

| CN | 104391407 A | 3/2015 |
| CN | 106125442 A | 11/2016 |
| JP | 2005017747 A | 1/2005 |

OTHER PUBLICATIONS

First office action of Chinese application No. 201711106551.6 dated Dec. 3, 2019.

(Continued)

*Primary Examiner* — Prabodh M Dharia
(74) *Attorney, Agent, or Firm* — Fay Sharpe LLP

(57) ABSTRACT

A display panel, a manufacturing method and driving method thereof are provided. The display panel includes a light transmittance adjusting layer and two pixel layers being respectively located on opposite surfaces of light transmittance adjusting layer. Each pixel layer includes multiple light-emitting units arranged in an array. Orthogonal projections of two pixel layers on the light transmittance adjusting layer do not overlap. When light transmittance of light transmittance adjusting layer is higher, light emitted from the light-emitting units on both surfaces of light transmittance adjusting layer is emergent from opposite sides through light transmittance adjusting layer. Two pixel layers display the same picture jointly. When light transmit- (Continued)

tance of light transmittance adjusting layer is lower, light emitted from light-emitting units on both surfaces of light transmittance adjusting layer cannot be transmitted through light transmittance adjusting layer to reach opposite sides. Two pixel layers display images independently.

20 Claims, 16 Drawing Sheets

(51) Int. Cl.
      *H01L 51/52*     (2006.01)
      *H01L 51/56*     (2006.01)
      *G09G 3/36*      (2006.01)
      *G09G 3/3208*    (2016.01)
      *G02F 1/1335*    (2006.01)
      *G02F 1/15*      (2019.01)

(52) U.S. Cl.
     CPC ........... *G09G 3/36* (2013.01); *H01L 51/5206* (2013.01); *H01L 51/56* (2013.01); *G02F 1/133528* (2013.01); *G02F 1/15* (2013.01); *H01L 51/5234* (2013.01); *H01L 2227/323* (2013.01); *H01L 2251/308* (2013.01); *H01L 2251/5323* (2013.01)

(58) Field of Classification Search
     USPC ............... 345/694; 313/505; 349/12; 257/59
     See application file for complete search history.

(56) References Cited

U.S. PATENT DOCUMENTS

| | | | |
|---|---|---|---|
| 9,898,112 B2* | 2/2018 | Wang | G06F 1/1641 |
| 2003/0227254 A1 | 12/2003 | Terumoto et al. | |
| 2005/0024339 A1* | 2/2005 | Yamazaki | G06F 1/1616 345/169 |
| 2006/0152931 A1* | 7/2006 | Holman | F21S 8/08 362/297 |
| 2010/0051902 A1* | 3/2010 | Hiura | B82Y 10/00 257/13 |
| 2012/0025192 A1* | 2/2012 | Shimizu | H01L 27/3211 257/59 |
| 2013/0321719 A1* | 12/2013 | Sumida | G02F 1/1333 349/12 |
| 2014/0185129 A1* | 7/2014 | Kim | H01L 51/5284 359/296 |
| 2015/0253604 A1* | 9/2015 | He | G02F 1/133512 349/42 |
| 2018/0005006 A1* | 1/2018 | Chai | G06K 9/0004 |

OTHER PUBLICATIONS

Takatoshi Tsujimura, Introduction to Organic Light-Emitting Diode, Jul. 31, 2015; pp. 52 and 55; Publishing House of Electronics Industry.

* cited by examiner

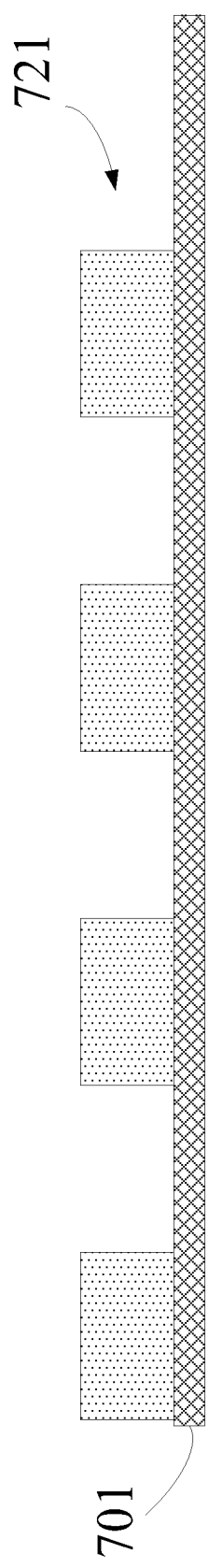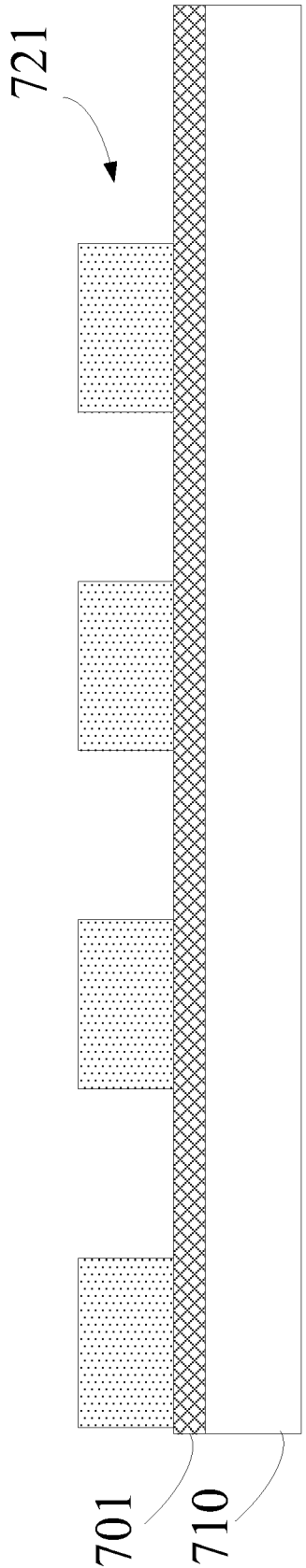

DISPLAY PANEL, DISPLAY DEVICE, AND MANUFACTURING METHOD AND DRIVING METHOD OF DISPLAY PANEL

This application claims priority to Chinese Patent Application No. 201711106551.6, filed with the State Intellectual Property Office on Nov. 10, 2017 and titled "DISPLAY PANEL, DISPLAY DEVICE, AND MANUFACTURING METHOD AND DRIVING METHOD OF DISPLAY PANEL", the entire contents of which are incorporated herein by reference.

TECHNICAL FIELD

The present disclosure relates to a display panel, a display device, a manufacturing method and a driving method of the display panel.

BACKGROUND

At present, most of the display devices on the market only support single-sided display. However, on many occasions for example, in digital signage, electronic communication equipment, cash register facilities, window inquiry facilities, and the advertisement playing facilities in public places such as exhibition halls, it is usually necessary for people on both sides of a display panel to view a picture displayed thereon simultaneously.

In order to achieve the double-sided display of the picture, two display panels are usually disposed back to back, and then are controlled to simultaneously display the same. In such a double-sided display mode, the two display panels actually work independently, and the display function is single.

SUMMARY

There are provided in the present disclosure a display panel, a display device, a manufacturing method and a driving method of the display panel.

There is provided in at least one embodiment of the present disclosure a display panel, comprising a light transmittance adjusting layer and two pixel layers, wherein the two pixel layers are located on opposite surfaces of the light transmittance adjusting layer respectively, each of the pixel layers comprises a plurality of light-emitting units arranged in an array, each of the light-emitting units has two light-emitting surfaces, one of the two light-emitting surfaces faces the light transmittance adjusting layer, and the other one of the two light-emitting surfaces is back to the light transmittance adjusting layer; orthogonal projections of the two pixel layers on the light transmittance adjusting layer do not overlap.

Optionally, each of the pixel layers comprises a plurality of rows of light-emitting units, each row of the light-emitting units extends in a first direction, the plurality of rows of light-emitting units of the two pixel layers are alternately arranged at intervals in a second direction, and the second is different from the first direction.

Optionally, the plurality of light-emitting units of the two pixel layers is alternately disposed at intervals in the first direction and the second direction, and the second direction is different from the first direction.

Optionally, each of the light-emitting units comprises a pixel unit.

Optionally, the light transmittance adjusting layer is one of a liquid crystal cell and electrochromic glass.

Optionally, the liquid crystal cell comprises two base substrates disposed opposite to each oilier in a cell-aligned manner, a liquid crystal layer, a liquid crystal control layer and two polarizers, the liquid crystal layer is sandwiched between the two base substrates, the liquid crystal control layer is disposed on at least one of the base substrates, the liquid crystal control layer is configured to control liquid crystal molecules in the liquid crystal layer to deflect, and the two base substrates are located between the two polarizers.

Optionally, the liquid crystal control layer comprises two transparent control electrodes, the two transparent control electrodes are respectively disposed on certain sides of the two base substrates close to the liquid crystal layer, and each of the transparent control electrodes is a surface electrode.

Optionally, the liquid crystal control layer comprises a plurality of strip-shaped transparent control electrodes disposed at intervals in parallel, the plurality of strip-shaped transparent control electrodes are disposed on the same base substrate, and the plurality of strip-shaped transparent electrodes are located on a side of the base substrate close to the liquid crystal layer.

Optionally, a passivation layer is disposed between the liquid crystal control layer and the base substrate.

Optionally, each light-emitting unit comprises at least one OILED light-emitting unit.

Optionally, each OLED light-emitting unit comprises a first electrode and a second electrode, and an organic light-emitting structure sandwiched between the first electrode and the second electrode, and the first electrode and the second electrode are both transparent electrodes.

Optionally, a transparent protective layer is disposed on a side of each of the pixel layers back to the light transmittance adjusting layer.

Optionally, the display panel further comprises: two source electrode driving units and two gate electrode driving units disposed in one-to-one correspondence with the two pixel layers.

There is provided in at least one embodiment of the present disclosure a display device, comprising any one of the display panels described above.

There is provided in at least one embodiment of the present disclosure a method for manufacturing a display panel, comprising steps of: forming a pixel layer on a surface of a light transmittance adjusting layer; and forming the other pixel layer on the other surface of the light transmittance adjusting layer; wherein each of the pixel layers comprises a plurality of light-emitting units arranged in an array, each of the light-emitting units has two light-emitting surfaces, one of the two light-emitting surfaces faces the light transmittance adjusting layer, the other of the two light-emitting surfaces is back to the light transmittance adjusting layer, and orthogonal projections of the two pixel layers on the light transmittance adjusting layer do not overlap.

Optionally, the step of forming a pixel layer on the surface of the light transmittance adjusting layer comprises the following step of: manufacturing a plurality of light-emitting units in the pixel layer on a surface of the light transmittance adjusting layer; and the step of forming the other pixel layer on the other surface of the light transmittance adjusting layer comprises the following step of: manufacturing a plurality of light-emitting units in the other pixel layer on the other surface of the light transmittance adjusting layer.

Optionally, the step of forming a pixel layer on the surface of the light transmittance adjusting layer comprises the steps of: forming a pixel layer on a side surface of a first substrate;

and attaching the other side surface of the first substrate to the first surface of the light transmittance adjusting layer; and the step of forming the other pixel layer on the other surface of the light transmittance adjusting layer comprises the steps of: forming a pixel layer on one side surface of a second substrate; and attaching the other side surface of the second substrate to the second surface of the light transmittance adjusting layer opposite to the first surface.

There is provided in at least one embodiment of the present disclosure a method for driving any one of the display panels described above, the driving method comprising the steps of: receiving a light transmittance control signal, and controlling the light transmittance adjusting layer to be in one of a non-light transmitting state and a light transmitting state according to the light transmittance control signal; controlling one of the pixel layers to display a first picture, and controlling the other one of the pixel layers to display a second picture when the light transmittance adjusting layer is in the non-light transmitting state; and controlling the two pixel layers to jointly display a third picture when the light transmittance adjusting layer is in the light transmitting state.

Optionally, the step of controlling the two pixel layers to jointly display the third picture comprises the steps of: acquiring image data of the third picture; dividing the image data of the third picture into a first part of image data and a second part of image data; controlling one of pixel layers to display a first part of the third picture according to the first part of the image data; and controlling the other one of the pixel layer to display a second part of the third picture according to the second part of the image data; wherein the second part of the third picture is a part of the third picture other than the first part.

Optionally, the method further comprises the following steps of: receiving a double-sided display control signal; and selectively controlling at least one of the two pixel layers to display a picture according to the double-sided display control signal.

BRIEF DESCRIPTION OF THE DRAWINGS

FIG. 9 to FIG. 12 are schematic diagrams of processes for manufacturing a display panel according to an embodiment of the present disclosure;

DETAILED DESCRIPTION

The present disclosure will be described in further detail with reference to the enclosed drawings, to clearly present the principles and advantages of the present disclosure.

Figure 1:
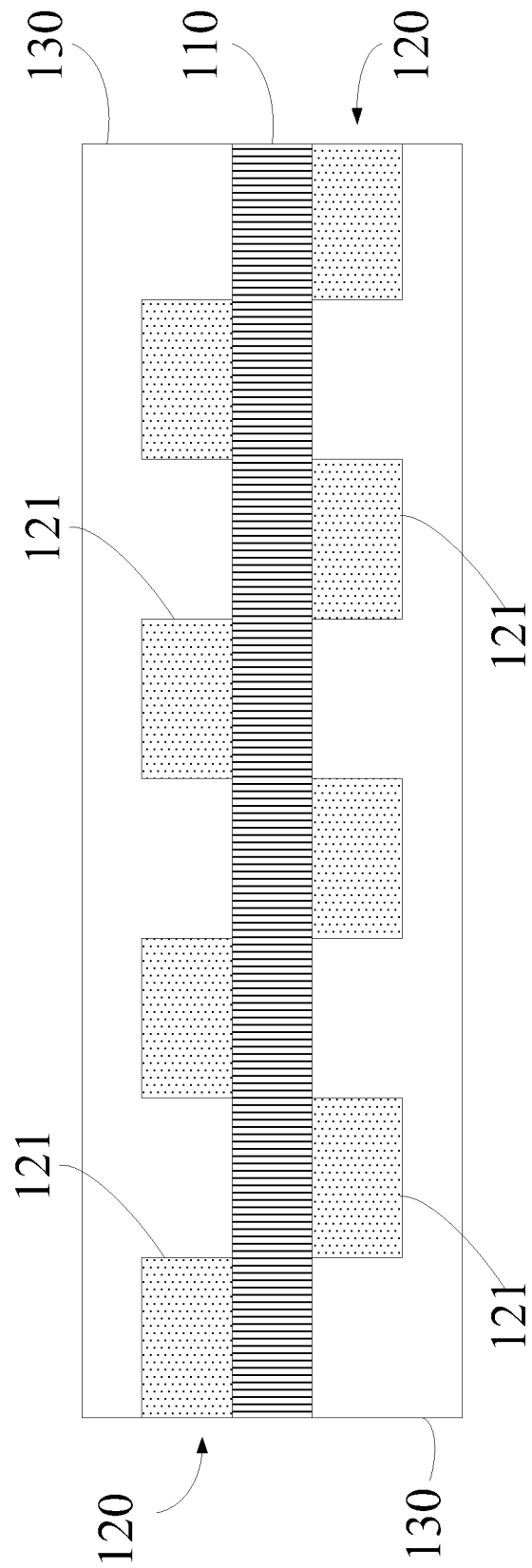
FIG. 1 is a schematic diagram of a partial structure of a display panel according to an embodiment of the present disclosure.

FIG. 1 is a schematic diagram of a partial structure of a display panel according to an embodiment of the present disclosure. As shown in FIG. 1, the display panel includes a light transmittance adjusting layer 110 and two pixel layers 120. The two pixel layers 120 are respectively located on opposite surfaces of the light transmittance adjusting layer 110. Each of the pixel layers 120 includes a plurality of light-emitting units 121 arranged in an array. Each of the light-emitting units 121 has two light-emitting surfaces, one of the two light-emitting surfaces faces the light transmittance adjusting layer 110, and the other one of the two light-emitting surfaces is back to the light transmittance adjusting layer 110. Orthogonal projections of the light-emitting units 121 of the two pixel layers 120 on the light transmittance adjusting layer 110 do not overlap.

By arranging the plurality of light-emitting units in an array on the opposite surfaces of the light transmittance adjusting layer respectively, when the light transmittance of the light transmittance adjusting layer is higher, the light emitted from the light-emitting units on both surfaces of the light transmittance adjusting layer can be emergent from the opposite sides through the light transmittance adjusting layer, so that the same picture jointly displayed by the light-emitting units located on both surfaces of the light transmittance adjusting layer can be observed on any side of the display device. When the light transmittance of the light transmittance adjusting layer is lowered, the light emitted from the light-emitting units on both surfaces of the light transmittance adjusting layer cannot be transmitted through the light transmittance adjusting layer to reach the opposite side. Therefore, the light-emitting units on one surface of the light transmittance adjusting layer displays one picture, and the light-emitting units on the other surface of the light transmittance adjusting layer display the other picture, thereby achieving the purpose of independently displaying the pictures on both surfaces of the light transmittance adjusting layer, and enriching the display function of the display panel.

Figure 2:
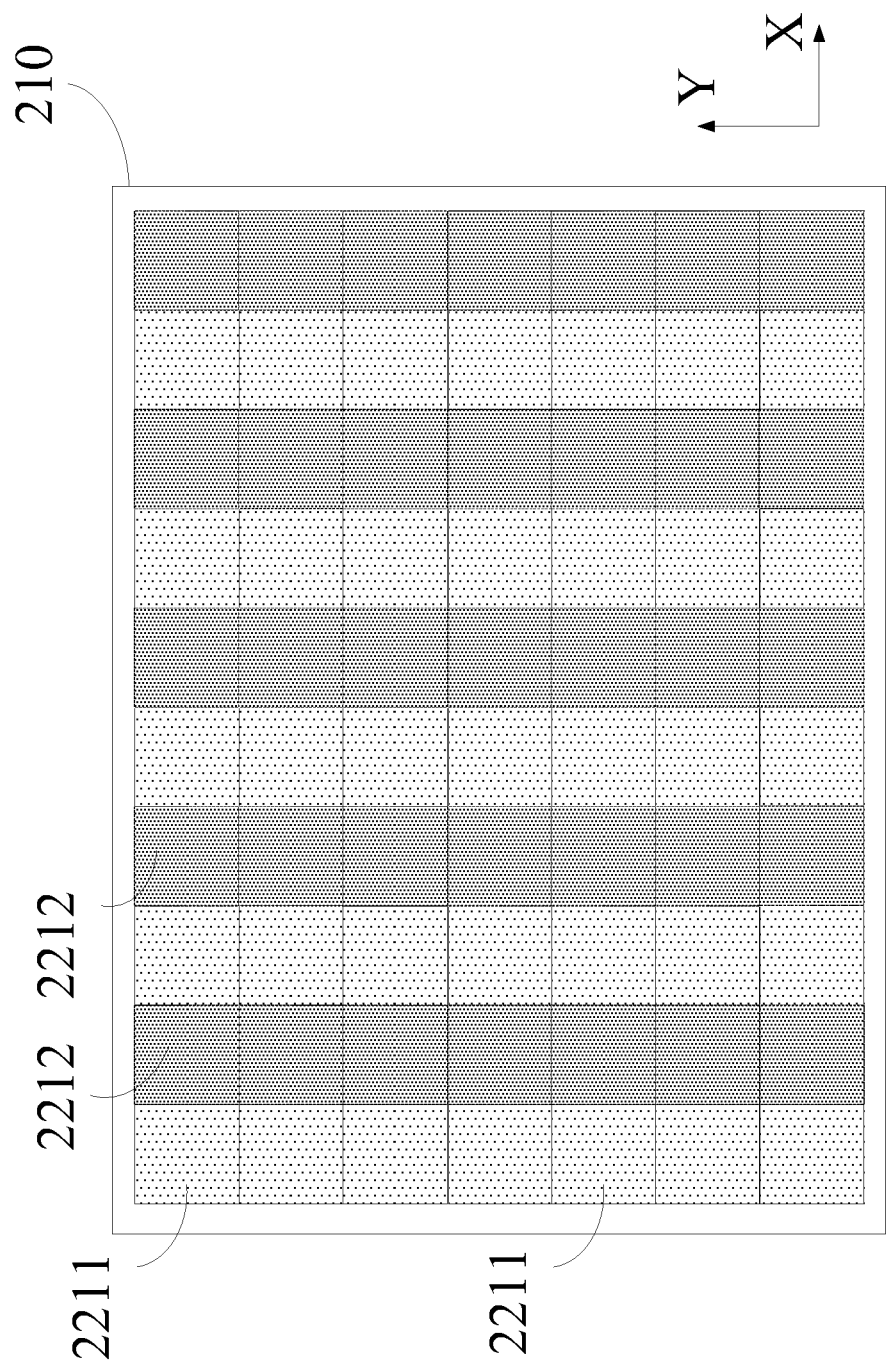
FIG. 2 is a schematic diagram of a display panel according to an embodiment of the present disclosure.

FIG. 2 is a partially enlarged schematic diagram of a display panel according to an embodiment of the present disclosure. As shown in FIG. 2, each pixel layer includes a plurality of rows of light-emitting units, such as the light-emitting units 2211 and the light-emitting units 2212 as shown in FIG. 2. Each row of light-emitting units extends along a first direction (such as Y direction in FIG. 2). The plurality of rows of light-emitting units of the two pixel layers are alternately arranged at intervals in a second direction (such as X direction in FIG. 2). The second direction is different from the first direction. In some embodiments, the first direction is perpendicular to the second direction.

In some embodiments, the first direction may be a column direction, and the second direction may be a row direction. Exemplarily, one surface of the light transmittance adjusting layer 210 is provided with a first pixel layer, and the first pixel layer includes a plurality of first light-emitting units 2211. The other surface of the light transmittance adjusting layer 210 is provided with a second pixel layer, and the second pixel layer includes a plurality of second light-emitting units 2212. FIG. 2 shows five columns of the first light-emitting units 2211 of the first pixel layer and five columns of the second light-emitting units 2212 of the second pixel layer. In the row direction, the five columns of the first light-emitting units 2211 and the five columns of the second light-emitting units 2212 are alternately disposed at intervals.

In other embodiments, the first direction may also be a row direction, and the second direction may be a column direction. Each pixel layer may include a plurality of rows of light-emitting units. The plurality of rows of light-emitting units of the two pixel layers are alternately arranged at intervals in the column direction.

Figure 3:
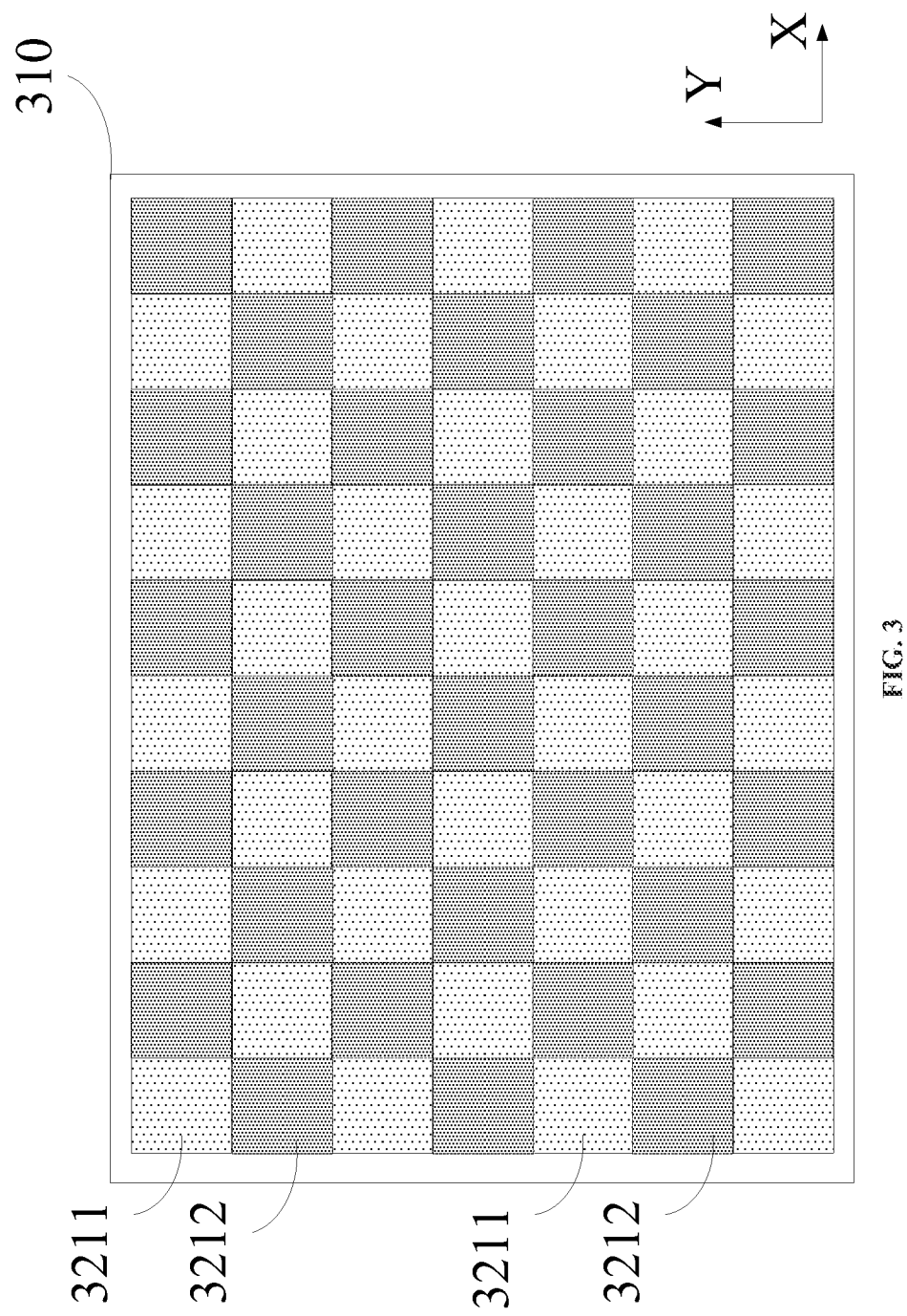
FIG. 3 is a partially enlarged schematic diagram of a display panel according to an embodiment of the present disclosure.

FIG. 3 is a partially enlarged schematic diagram of a display panel according to an embodiment of the present disclosure. As shown in FIG. 3, the plurality of light-emitting units 3211 and 3212 of the two pixel layers are alternately arranged at intervals in a first direction (such as Y direction in FIG. 3) and a second direction (such as X direction in FIG. 3).

By taking the first direction being the column direction and the second direction being the row direction as an example, FIG. 3 shows 35 first light-emitting units 3211 in the first pixel layer. The 35 first light-emitting units 3211 are arranged at intervals in 7 rows and 10 columns. FIG. 3 also shows 35 second light-emitting units 3212 in the second pixel layer. The 35 second light-emitting units 3212 are arranged at intervals in 7 rows and 10 columns. One second light-emitting unit 3212 is arranged between any two first light-emitting units 3211 in each row of first light-emitting units 3211. One second light-emitting unit 3212 is disposed between any two first light-emitting units 3211 in each column of first light-emitting units 3211. In this way, the light-emitting units on the light transmittance adjusting layer 310 can be distributed more uniformly, which is advantageous for improving the display effect.

Optionally, each light-emitting unit may include one pixel unit. By taking the display panel as shown in FIG. 3 as an example, when each of the first light-emitting unit 3211 and the second light-emitting unit 3212 includes only one pixel unit, both of the interval between any two adjacent first light-emitting units 3211 in the same row and the interval between any two adjacent first light-emitting units 3211 in the same column may be set to be minimal, thereby enabling the distribution of the pixel units to be more uniform, and it is advantageous for improving a resolution of the display panel.

Exemplarily, each light-emitting unit may include at least one organic light-emitting diode (OLED) light-emitting unit. The use of the OLED light-emitting units is advantageous for reducing the thickness of the display panel.

When each light-emitting unit corresponds to one pixel unit, each light-emitting unit may include a plurality of OLED light-emitting units. For example, for the display panel in which each pixel includes sub-pixels with three colors of red, green and blue, each light-emitting unit may include an OLED light-emitting unit emitting red light, an OLED light-emitting unit emitting green light, and an OLED light-emitting unit emitting blue light.

It should be noted that for the display panel only displaying one color, each light-emitting unit may also only include one OLED light-emitting unit. For example, for the display panel only displaying red color, each light-emitting unit may include one OLED light-emitting unit emitting red light.

In addition, each light-emitting unit may further correspond to a plurality of pixel units, and then each light-emitting unit may include a plurality of OLED light-emitting units.

In some embodiments, the display panel may further include two source electrode driving units and two gate electrode driving units arranged in one-to-one correspondence with the two pixel layers. The source electrode driving units and the gate electrode driving units cooperate with each other, so as to control the pixel layers to display.

In some embodiments, each OLED light-emitting unit in each light-emitting unit is provided with a corresponding driving circuit.

Figure 4:
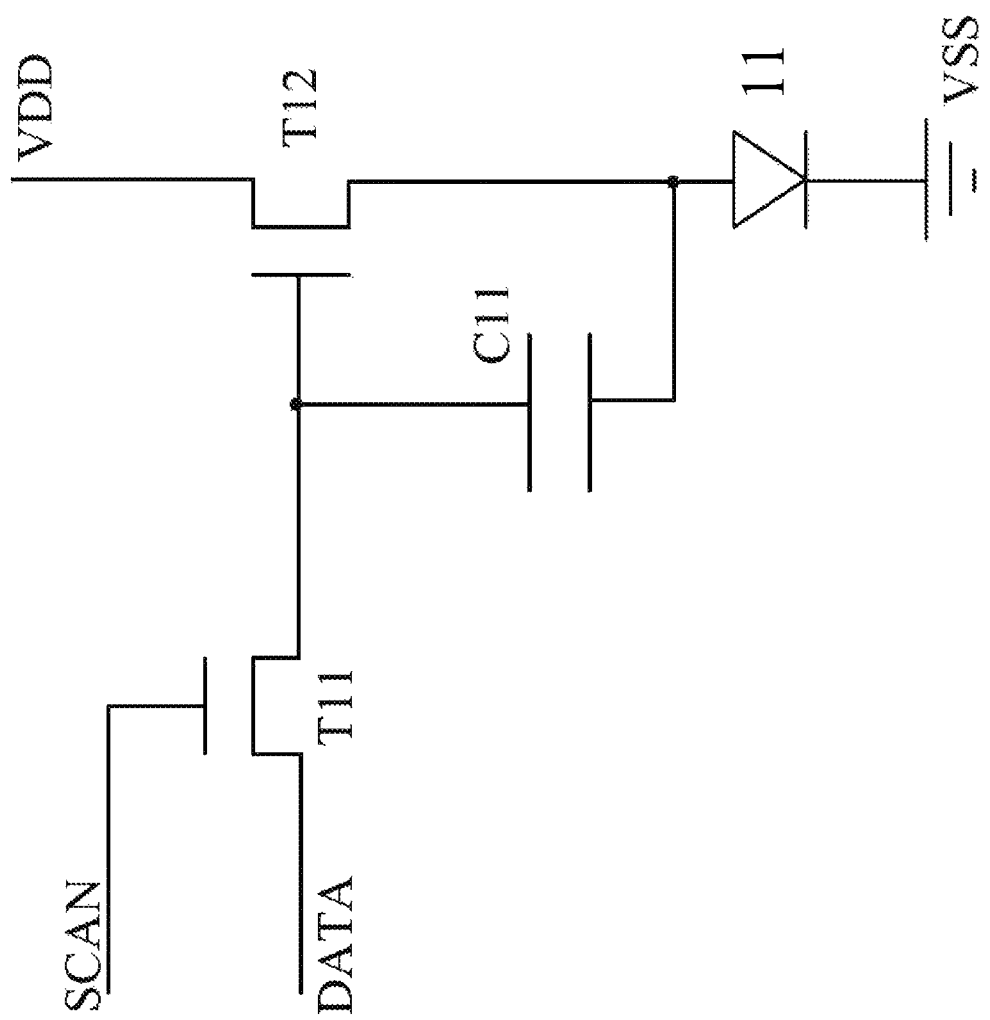
FIG. 4 is a circuit diagram of a driving circuit according to an embodiment of the present disclosure.

FIG. 4 is a circuit diagram of a driving circuit according to an embodiment of the present disclosure. As shown in FIG. 4, a driving circuit of an OLED light-emitting unit 11 includes a transistor T11, a transistor T12, and a capacitor C11. A gate electrode of the transistor T11 is connected to a signal scanning line SCAN. A source electrode of the transistor T11 is connected to a data line DATA. A drain electrode of the transistor T11 is connected to one end of the capacitor C11. The other end of the capacitor C11 is connected to an anode of a light-emitting device of the OLED light-emitting unit 11. The other end of the capacitor C11 is also connected to a gate electrode of the transistor T12. A source electrode of the transistor T12 is connected to a high-level power line VDD. A drain electrode of the transistor T12 is connected to the anode of the OLED light-emitting unit 11. A cathode of the OLED light-emitting unit 11 is connected to a low-level power line VSS.

By taking the transistor T11 being an N-type transistor as an example, the working process of the driving circuit includes: in a configuration phase, when the signal scanning line SCAN is at a high level, the transistor T11 is turned on and a configuration voltage outputted on the data line DATA is transmitted to the gate of the transistor T12. The configuration voltage is a threshold voltage of the transistor T12, which enables the transistor T12 to enter a saturation current region. In a display phase, the data line DATA outputs a corresponding data voltage VDATA when the OLED light-emitting unit 11 is about to display, so as to charge the capacitor C11. Such a phase is a main charging phase. Afterwards, the signal scanning line SCAN is caused to be at a low level, and the transistor T11 is turned off, but the data held on the capacitor C11 can still enable the transistor T12 to be in a saturation current region. The high-level power line VDD continues to supply a voltage to the OLED light-emitting unit 11 until the arrive of the next configuration phase, which is then repeated in this way.

In addition, since the threshold voltage changes after the transistor is operated for a long time, a threshold value collecting unit may also be set to collect the threshold voltage of the transistor in real time, so as to compensate for the configuration voltage.

It should be noted that the structure of the driving circuit as shown in FIG. 4 is merely an example. The driving circuit with other structural forms may also be used in practical application, and the disclosure is not limited thereto.

Figure 5:
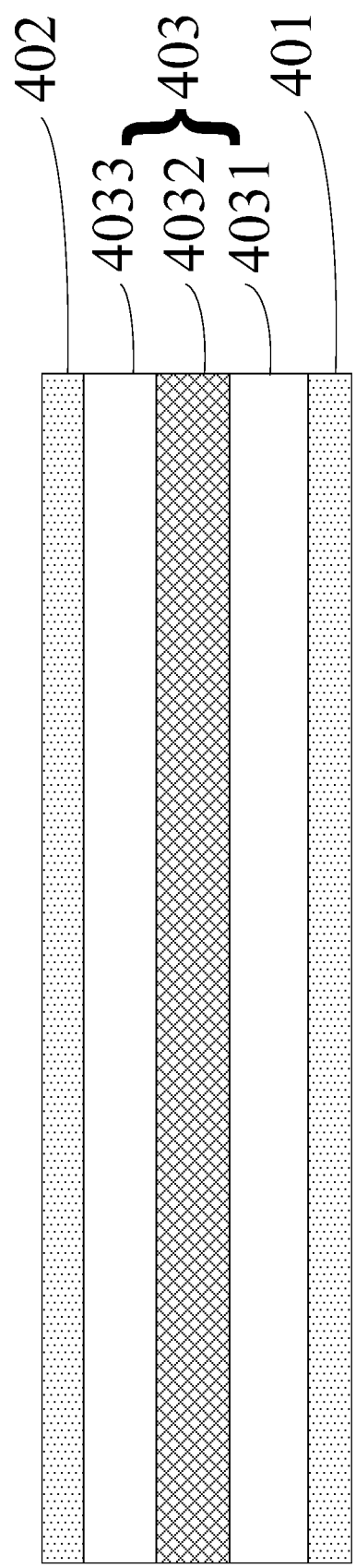
FIG. 5 is a schematic diagram of a partial structure of a light-emitting unit according to an embodiment of the present disclosure.

FIG. 5 is a schematic diagram of a partial structure of the light-emitting unit according to an embodiment of the present disclosure. As shown in FIG. 5, each OLED light-emitting unit may include a first electrode 401 and a second electrode 402, and an organic light-emitting structure 403 sandwiched between the first electrode 401 and the second electrode 402. The organic light-emitting structure 403 includes, but is not limited to, a hole transport layer 4031, a light-emitting layer 4032, and an electron transport layer 4033 which are sequentially stacked.

One electrode of the OLED light-emitting unit may be directly arranged on the surface of the light transmittance adjusting layer, for example the first electrode 401 in FIG. 5, which is advantageous for reducing the thickness of the display panel. The first electrode 401 and the second electrode 402 are both transparent electrodes, and can enable the light emitted from the OLED light-emitting unit to be emergent from two opposite surfaces of the OLED light-emitting unit.

Exemplarily, both the first electrode 401 and the second electrode 402 may be made of indium tin oxide (ITO).

Referring to FIG. 1 again, in some embodiments, a transparent protective layer 130 may be disposed on each pixel layer 120. By disposing the transparent protective layer 130, it is favorable to protect the OLED light-emitting unit and extend the service life of the display panel. Exemplarily, the transparent protective layer 130 may be silicon dioxide, silicon nitride, or the like.

Figure 6:
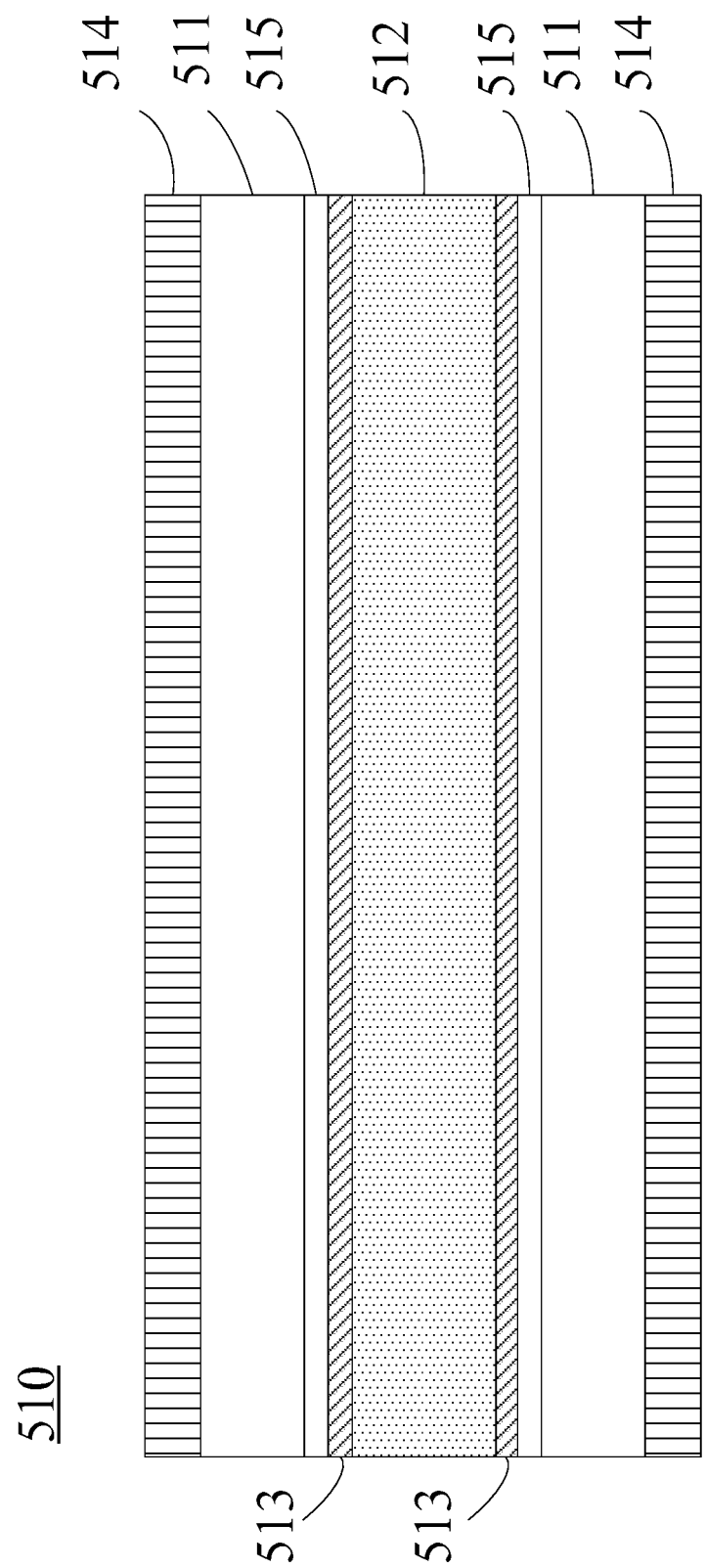
FIG. 6 is a schematic diagram of a partial structure of a light transmittance adjusting layer according to an embodiment of the present disclosure.

FIG. 6 is a schematic diagram of a partial structure of the light transmittance adjusting layer according to an embodiment of the present disclosure. As shown in FIG. 6, the light transmittance adjusting layer may be a liquid crystal cell 510. The transmittance of the light is easy to be controlled by the liquid crystal cell 510, and the manufacturing technology of the liquid crystal cell is mature, which is advantageous for reducing the cost.

As shown in FIG. 6, the liquid crystal cell 510 may include two base substrates 511 disposed opposite to each other in a cell-aligned manner, a liquid crystal layer 512, liquid crystal control layers 513, and two polarizers 514. The liquid crystal layer 512 is sandwiched between the two base substrates 511. The liquid crystal control layers 513 are disposed on both sides of the liquid crystal layer 512 and configured to control the deflection of liquid crystal molecules in the liquid crystal layer 512 to deflect. The two base substrates 511 are located between the two polarizers 514.

In the embodiment as shown in FIG. 6, the liquid crystal control layers 513 may be disposed on the opposite surfaces of the two base substrates 511 respectively. The liquid crystal layer 512 is sandwiched between the liquid crystal control layers 513.

The two polarizers 514 may be respectively disposed on certain sides of the two base substrates 511 away from the liquid crystal control layers 513. The polarizer 514 may include a polarizing film which is adhered to the base substrate 511. Hence, it is advantageous for reducing the thickness of the liquid crystal cell.

Optionally, a passivation layer 515 may be further disposed between the liquid crystal control layer 513 and the base substrate 511 to prevent a chemical reaction between the liquid crystal control layer and the base substrate. Exemplarily, the passivation layer 515 may be a silicon dioxide layer.

Optionally, the liquid crystal control layer 513 may include two transparent control electrodes respectively formed on certain sides of the two base substrates 511 close to the liquid crystal layer 512. Each transparent control electrode may be a surface electrode, and an area of the surface electrode may be the same as an area of the base substrate. In this way, all the liquid crystal molecules can be simultaneously controlled by using the surface electrodes, and the light emitted from the light-emitting units at each position on the light transmittance adjusting layer can be transmitted through the light transmittance adjusting layer. For example, when there is a specific voltage difference between the two surface electrodes, the liquid crystal layer presents a transparent state. When there is no voltage difference between the two surface electrodes, the liquid crystal layer presents an opaque state. The use of the surface electrodes facilitates the formation of the control electrodes. The manufacturing process of the liquid crystal cell can be simplified, and is convenient to control.

In other embodiments, the liquid crystal control layer may also be a plurality of strip-shaped transparent control electrodes disposed in parallel at intervals. The plurality of strip-shaped transparent control electrodes are located on one of the base substrates 511, and the plurality of strip-shaped transparent control electrodes are located on one side of the base substrate 511 close to the liquid crystal layer 512. By applying different voltages to the adjacent transparent control electrodes, an electric field can be generated between the adjacent transparent control electrodes, and the liquid crystal molecules will be deflected under an action of the electric field.

A plurality of photo spacers (PS) may also be disposed between the two base substrates 511. The plurality of photo spacers may be uniformly distributed, for example, arranged in an array, so as to support the two base substrates 511.

In another implementation of the present disclosure, the light transmittance adjusting layer may also be electrochromic glass. The light transmittance of the electrochromic glass can be changed under the action of electricity, so that the light emitted from the light-emitting units on both surfaces of the light transmittance adjusting layer is transmitted through the light transmittance adjusting layer. In addition, the color of the electrochromic glass can also be changed under the action of electricity to filter the light, thereby acquiring different display effects.

There is further provided in the embodiment of the present disclosure a display device including any of the display panels shown in FIGS. 1 to 3.

The display device may be used in medical, advertisement player, and outdoor display fields.

Figure 7:
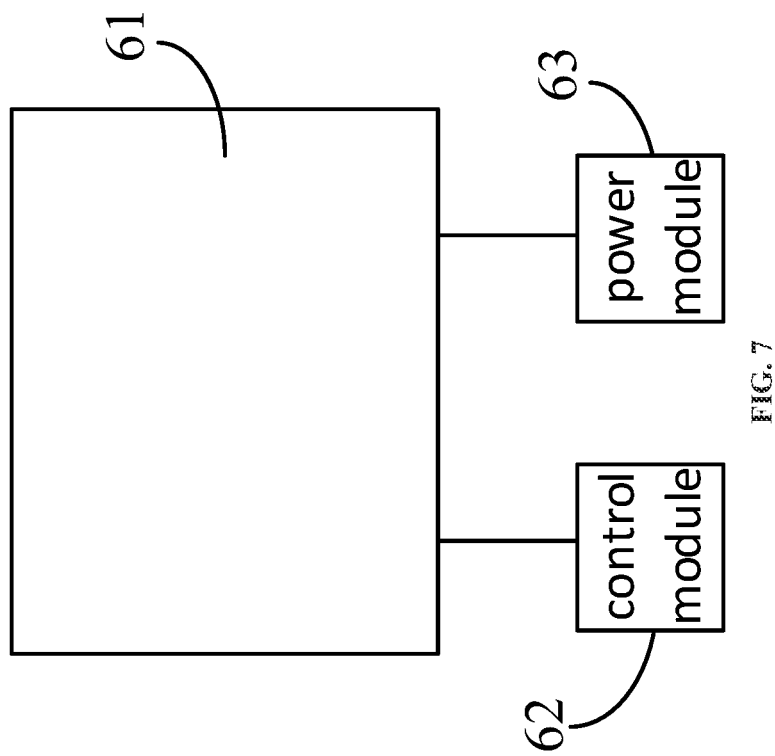
FIG. 7 is a block diagram of a display device according to an embodiment of the present disclosure.

FIG. 7 is a block diagram of a structure of a display device according to an embodiment of the present disclosure. As shown in FIG. 7, the display device in the embodiment of the present disclosure may further include a control module 62 for controlling the display panel 61 to display. Meanwhile, the display device in the embodiment of the present disclosure may further include a power module 63 for supplying power to the display panel 61.

By arranging the plurality of light-emitting units in an array on the opposite surfaces of the light transmittance adjusting layer respectively, when the light transmittance of the light transmittance adjusting layer is higher, the light emitted from the light-emitting units on both surfaces of the light transmittance adjusting layer can be emergent from the opposite sides through the light transmittance adjusting layer, so that the same picture jointly displayed by the light-emitting units located on both surfaces of the light transmittance adjusting layer can be observed on any side of the display device. When the light transmittance of the light transmittance adjusting layer is lowered, the light emitted from the light-emitting units on both surfaces of the light transmittance adjusting layer cannot be transmitted through the light transmittance adjusting layer to reach the opposite sides. Therefore, the light-emitting units on one surface of the light transmittance adjusting layer displays one picture, and the light-emitting units on the other surface of the light transmittance adjusting layer display the other picture, thereby achieving the purpose of independently displaying the pictures by the light-emitting units on both surfaces, and enriching the display function of the display panel.

Figure 8:
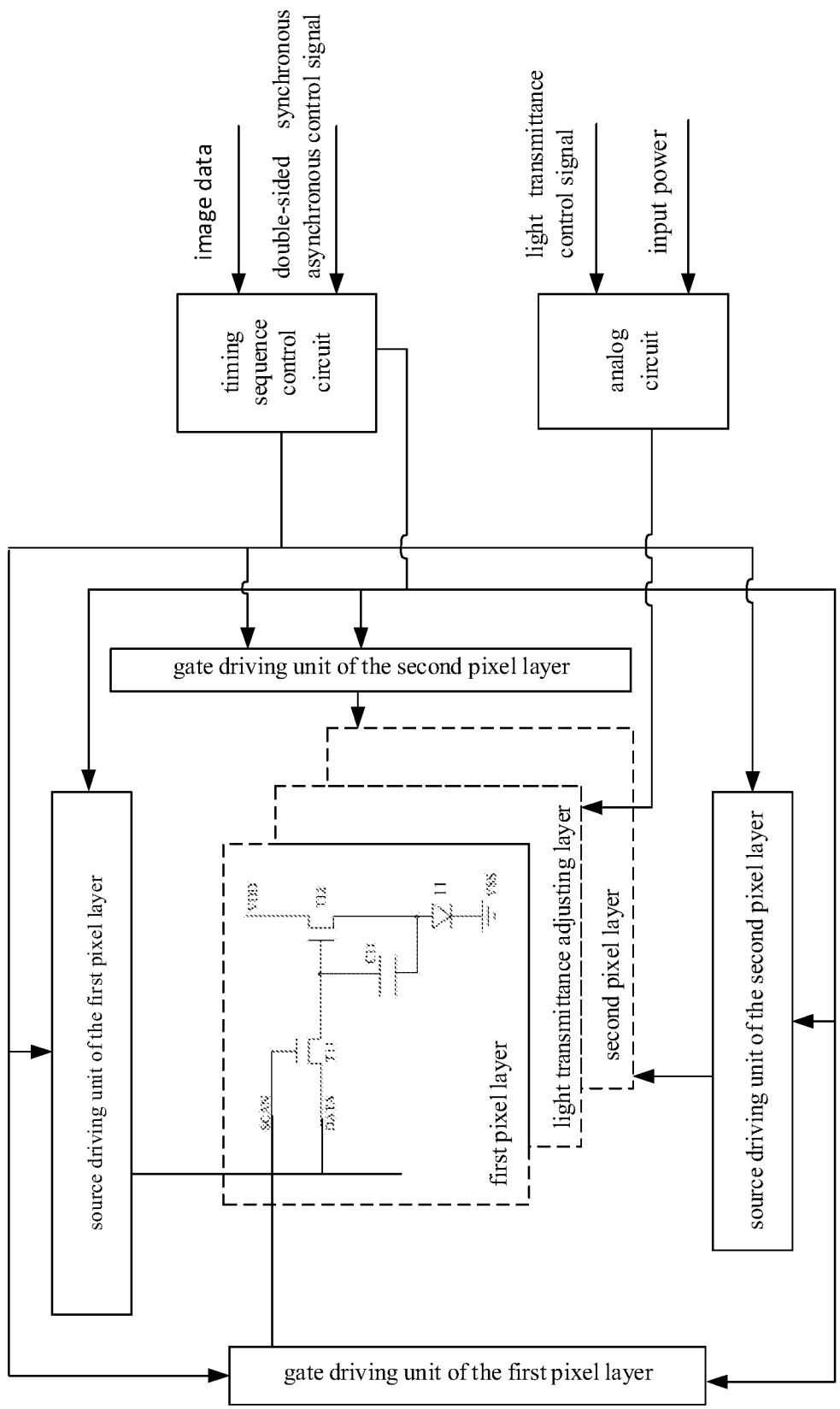
FIG. 8 is a schematic diagram of the structure of the display device shown in FIG. 7.
Figure 11:
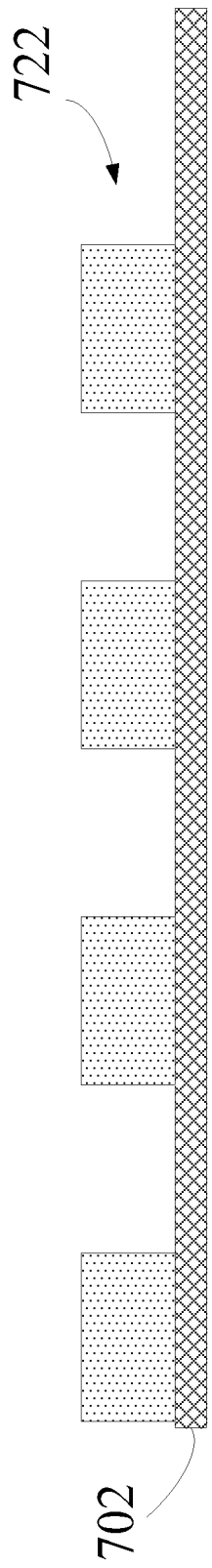
Figure 12:
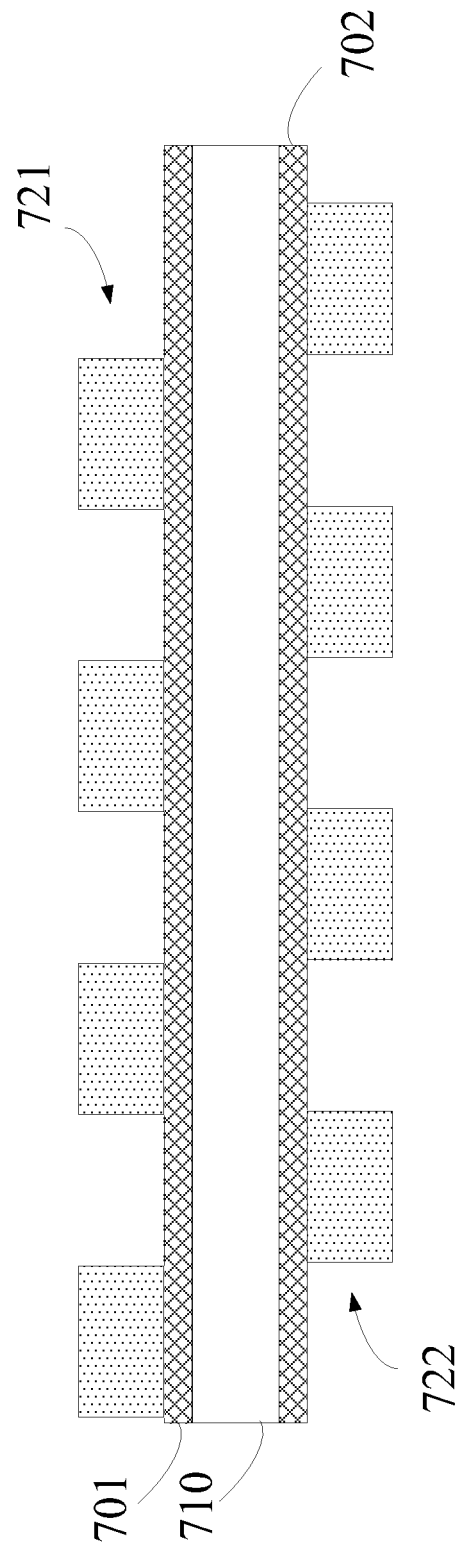

FIG. 8 is a schematic diagram of a structure of the display device shown in FIG. 7. The display device may adopt the driving circuit shown in FIG. 4. As shown in FIG. 8, the power module supplies power to the display panel via an analog circuit. A light transmittance control signal is input to the light transmittance adjusting layer via the analog circuit to adjust a light transmitting state of the light transmittance adjusting layer. A double-sided synchronous asynchronous control signal can control the manners of inputting image data to the first pixel layer and the second pixel layer. The image data can be input to a source electrode driving unit of the first pixel layer, a gate electrode driving unit of the first pixel layer, a source electrode driving unit of the second pixel layer, and a gate electrode driving unit of the second pixel layer respectively via a timing sequence control circuit, so as to enable the first pixel layer and the second pixel layer display to display corresponding pictures. The display process may refer to the embodiments as shown in FIGS. 15 to 19.

There is further provided in the embodiments of the present disclosure a method for manufacturing a display panel, including: forming a pixel layer on opposite surfaces of the light transmittance adjusting layer respectively. Here, each of the pixel layers includes a plurality of light-emitting units disposed in an array. For each light-emitting unit, one light-emitting surface of the light-emitting unit faces the light transmittance adjusting layer, the other light-emitting surface of light-emitting unit is back to the light transmittance adjusting layer, and orthogonal projections of the two pixel layers on the light transmittance adjusting layer do not overlap.

By arranging the plurality of light-emitting units in an array on the opposite surfaces of the light transmittance adjusting layer respectively, when the light transmittance of the light transmittance adjusting layer is higher, the light emitted from the light-emitting units on both surfaces of the light transmittance adjusting layer can be emergent from the opposite sides through the light transmittance adjusting layer, so that the same picture jointly displayed by the light-emitting units located on both surfaces of the light transmittance adjusting layer can be observed on any side of the display device. When the light transmittance of the light transmittance adjusting layer is lowered, the light emitted from the light-emitting units on both surfaces of the light transmittance adjusting layer cannot be transmitted through the light transmittance adjusting layer to reach the opposite sides. Therefore, the light-emitting units on one surface of the light transmittance adjusting layer displays one picture, and the light-emitting units on the other surface of the light transmittance adjusting layer display the other picture, thereby achieving the purpose of independently displaying the pictures on both surfaces of the light transmittance adjusting layer, and enriching the display function of the display panel.

In an implementation of an embodiment of the present disclosure, as shown in FIGS. 9 to 12, the manufacturing method may include the following steps.

A pixel layer 721 is made on a side surface of a first substrate 701, referring to FIG. 9. The other side surface of the first substrate 701 is attached to the first surface of a light transmittance adjusting layer 710, referring to FIG. 10. A pixel layer 722 is made on a side surface of the second substrate 702, referring to FIG. 11. The other side surface of the second substrate 702 is attached to the second surface of the light transmittance adjusting layer 710 opposite to the first surface, referring to FIG. 12.

Here, each of the first substrate 701 and the second substrate 702 may be an array substrate. By taking the light-emitting unit including the OLED light-emitting unit as an example, a plurality of OLED light-emitting units may be manufactured on the first substrate 701 and the second substrate 702 in a manner of evaporation during manufacturing. In addition, a plurality of OLED light-emitting units may also be manufactured in a manner of printing or the like.

Figure 13:
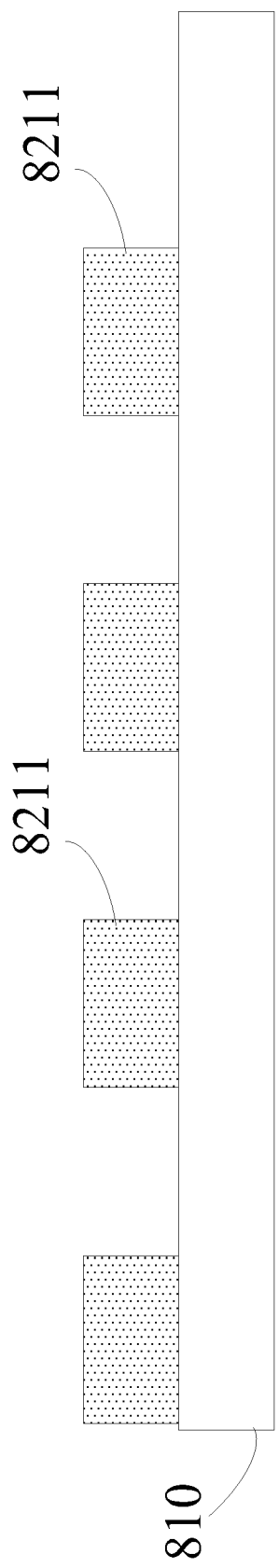
FIG. 13 to FIG. 14 are schematic diagrams of processes for manufacturing a display panel according to an embodiment of the present disclosure.
Figure 14:
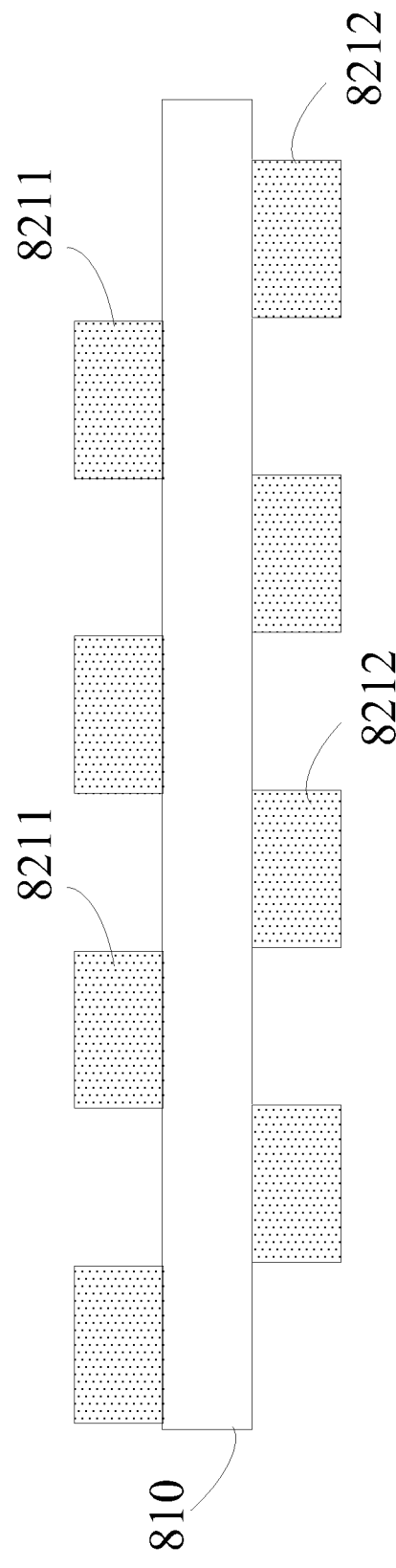

In an implementation of an embodiment of the present disclosure, as shown in FIG. 13 to FIG. 14, the display panel may also be manufactured in the following steps: a plurality of light-emitting units 8211 are made on a side surface of a light transmittance adjusting layer 810, referring to FIG. 13, and then a plurality of light-emitting units 8212 are made on the other side surface of the light transmittance adjusting layer 810, referring to FIG. 14.

It is advantageous to reduce the thickness of the display panel by directly manufacturing the light-emitting units on both side surfaces of the light transmittance adjusting layer 810.

By taking the light-emitting unit including the OLED light-emitting unit as an example, when the OLED light-emitting units are directly manufactured on the light transmittance adjusting layer 810, and the OLED light-emitting units can be manufactured in a manner of evaporation, printing or the like.

Figure 15:
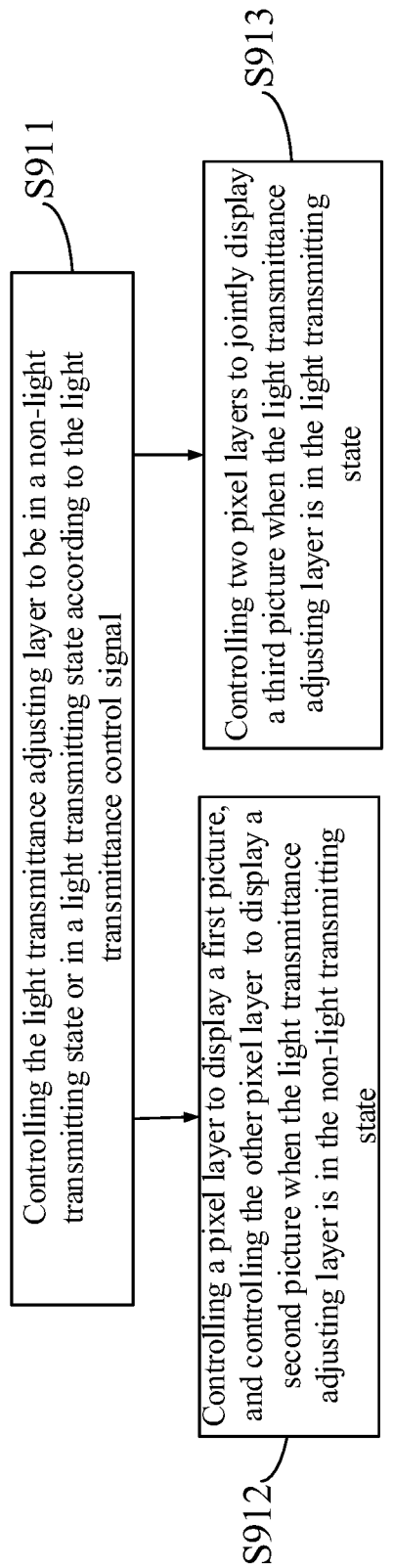
FIG. 15 is a flowchart of a driving method according to an embodiment of the present disclosure.

FIG. 15 is a flowchart of a driving method according to an embodiment of the present disclosure. The driving method is applicable to any one of the display panels shown in FIGS. 1 to 3. As shown in FIG. 15, the driving method includes the following operations.

In step S911, a light transmittance control signal is received, and the light transmittance adjusting layer is controlled to be in a non-light transmitting state or in a light transmitting state according to the light transmittance control signal. When the light transmittance adjusting layer is in the non-light transmitting state, step S912 is performed. When the light transmittance adjusting layer is in the light transmitting state, step S913 is performed.

Referring to FIG. 8, the light transmittance control signal may be transmitted to the light transmittance adjusting layer via an analog circuit. Exemplarily, the light transmittance control signal may be a high-low level signal. The low-level light transmittance control signal may control the light transmittance adjusting layer to be in the non-light transmitting state. The high-level light transmittance control signal may control the light transmittance adjusting layer to be in the light transmitting state.

In step S912, a pixel layer is controlled to display a first picture, and the other pixel layer is controlled to display a second picture.

Referring to FIG. 8, when the light transmittance adjusting layer is in the non-light transmitting state, the display panel receives the double-sided synchronous asynchronous control signal. The double-sided synchronous asynchronous control signal may be the high-low level signal. If the display panel receives the high-level double-sided synchronous asynchronous control signal, the image data are controlled to be input to the source driving unit of the first pixel layer, the gate driving unit of the first pixel layer, the source driving unit of the second pixel layer and the gate driving unit of the second pixel layer respectively via a timing sequence control circuit, so as to enable the first pixel layer to display the first picture and the second pixel layer to display the second picture.

Optionally, the first picture and the second picture may be the same or different pictures.

In some embodiments, the light transmittance control signal is configured to control the light transmitting state of the light transmittance adjusting layer. The double-sided synchronous asynchronous control signal is configured to control the display data input to the two pixel layers. For example, when the light transmittance control signal is a low-level signal, the light transmittance adjusting layer is non-light transmitting. When the double-sided synchronous asynchronous control signal is a high-level signal, different display data can be input to the two pixel layers respectively, such that the two pixel layers display different pictures respectively. The same display data may also be input to the two pixel layers respectively, so that the two pixel layers display the same picture.

In step S913, two pixel layers are controlled to jointly display a third picture.

When the light transmittance adjusting layer is in the light transmitting state, if the display panel receives the low-level double-sided synchronous asynchronous control signal, the image data are controlled to be input to the source driving unit of the first pixel layer, the gate driving unit of the first pixel layer, the source driving unit of the second pixel layer, and the gate driving unit of the second pixel layer respectively via the timing sequence control circuit, so that the first pixel layer and the second pixel layer jointly display the third picture.

Optionally, in some embodiments, a double-sided display control signal may also be set and configured to control whether the display panel performs double-sided display or single-sided display. Correspondingly, the method may further include: receiving the double-sided display control signal, and selectively controlling one of the two pixel layers to display the picture or controlling the two pixel layers to display the picture according to the double-sided display control signal.

The double-sided display control signal may also be a high-low level signal. For example, when the double-sided display control signal is a high-level signal, it means that the display panel can only perform single-sided display (i.e., only one of the two pixel layers can be controlled to the display the picture). When the double-sided display control signal is a low-level signal, it means that the display panel can only perform double-sided display.

When the display panel can only perform double-sided display, whether the two pixel layers independently display the picture or jointly display the third picture is determined by using the above light transmittance control signal and the double-sided synchronous asynchronous control signal. Exemplarily, when the double-sided display control signal indicates to perform the double-sided display, the display panel controls the light transmittance adjusting layer to be in the non-light transmitting state or the light transmitting state according to the light transmittance control signal. When the light transmittance adjusting layer is in the non-light transmitting state, under the indication of the double-sided synchronous asynchronous control signal, the two pixel layers are controlled to display a first picture and a second picture respectively. When the light transmittance adjusting layer is in the light transmitting state, under the indication of the double-sided synchronous asynchronous control signal, the two pixel layers are controlled to jointly display the third picture.

By arranging respectively the plurality of light-emitting units in an array on the opposite surfaces of the light transmittance adjusting layer, when the light transmittance of the light transmittance adjusting layer is higher, the light emitted from the light-emitting units on both surfaces of the light transmittance adjusting layer can be emergent from the opposite sides through the light transmittance adjusting layer, so that the same picture jointly displayed by the light-emitting units located on both surfaces of the light transmittance adjusting layer can be observed on any side of the display device. When the light transmittance of the light transmittance adjusting layer is lowered, the light emitted from the light-emitting units on both surfaces of the light transmittance adjusting layer cannot be transmitted through the light transmittance adjusting layer to reach the opposite sides. Therefore, the light-emitting units on one surface of the light transmittance adjusting layer displays one picture, and the light-emitting units on the other surface of the light transmittance adjusting layer display the other picture, thereby achieving the purpose of independently displaying the pictures on both surfaces of the light transmittance adjusting layer, and enriching the display function of the display panel.

Figure 16:
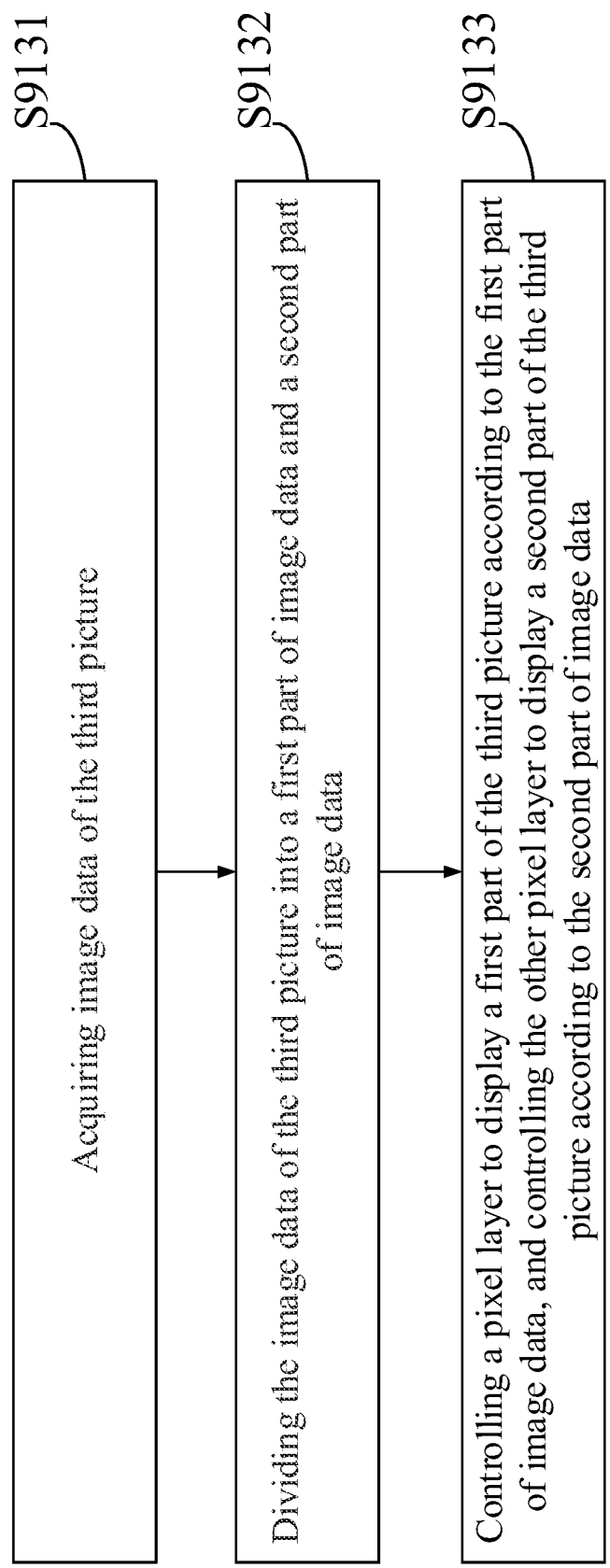
FIG. 16 is a flowchart of a method for displaying jointly by two pixel layers according to an embodiment of the present disclosure.

FIG. 16 is a flowchart of a method for displaying jointly by two pixel layers according to an embodiment of the present disclosure. As shown in FIG. 16, the step S913 may include the following operations.

In step S9131, image data of the third picture is acquired.

In step S9132, the image data of the third picture is divided into a first part of image data and a second part of image data.

The low-level double-sided synchronous asynchronous control signal may control the timing sequence control circuit to process the image data signal of the third picture, thereby obtaining a first part of image data and a second part of image data. For example, the first part of image data may be the display data of odd-numbered rows and odd-numbered columns as well as even-numbered rows and even-numbered columns of the third picture; and the second part of image data may be the display data of odd-numbered rows and even-numbered columns as well as even-numbered rows and odd-numbered columns of the third picture.

In step S9133, a pixel layer is controlled to display a first part of the third picture according to the first part of image data, and the other pixel layer is controlled to display a second part of the third picture according to the second part of image data.

Here, the second part of the third picture is a part of the third picture other than the first part.

The timing sequence control circuit inputs the signals of the first part of image data and the signals of the second part of image data to the two pixel layers respectively. Therefore, a pixel layer displays the first part of the third picture and the other pixel layer displays the second part of the third picture.

During displaying, the image data of the third picture may be divided into the first part of image data and the second part of image data according to the relative positions of orthogonal projections of the first light-emitting units on the first pixel layer and the second light-emitting units on the second pixel layer on the light transmittance adjusting layer.

In the following, the case that the display panel shown in FIG. 2 is driven to display a frame of picture is taken as an example for explanation. When the light transmittance control signal is at the high level and the double-sided synchronous asynchronous control signal is at the low level, the light transmittance adjusting layer is light-transmitting, and the display data of adjacent columns of the same picture may be input to the two pixel layers respectively. For example, the display data of odd-numbered columns in the picture may be input to the first pixel layer, and the display data of even-numbered columns may be input to the second pixel layer. Thus, the picture displayed by the first pixel layer and the second pixel layer that are alternated in the row direction is displayed on any surface of the display panel, so that a viewer can observe a complete picture jointly displayed by the first pixel layer and the second pixel layer.

In the following, the case that the display panel shown in FIG. 3 is driven to display a frame of picture is taken as an example for explanation. When the light transmittance control signal is at the high level and the double-sided synchronous asynchronous control signal is at the low level, the light transmittance adjusting layer is light-transmitting. The display data of odd-numbered rows and odd-numbered columns and even-numbered rows and even-numbered columns in the same picture may be input to the first pixel layer. The display data of odd-numbered rows and even-numbered columns and even-numbered rows and odd-numbered columns in the same picture may be input to the second pixel layer. Thus, the picture displayed by the first pixel layer and the second pixel layer that are alternated in the row direction and column direction is displayed on any surface of the display panel, so that the viewer can observe a complete picture jointly displayed by the first pixel layer and the second pixel layer.

Figure 17:
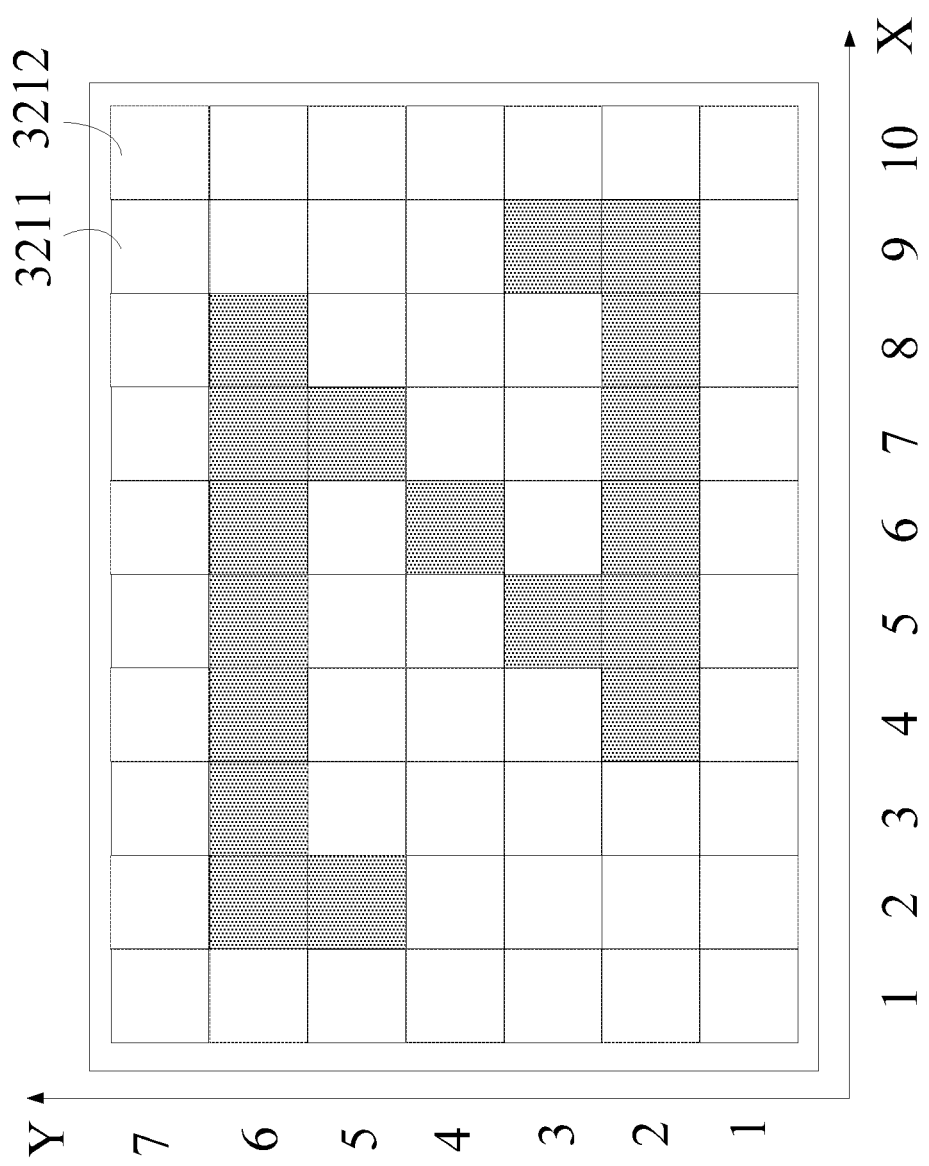
FIG. 17 is a schematic diagram of a display picture of a display panel according to an embodiment of the present disclosure.

Taking the display panel, which is shown in FIG. 3, displaying the picture shown in FIG. 17 as an example, the solid line rectangle in the drawing represents the first light-emitting unit 3211 in a pixel layer, and the dotted line rectangle thereof represents the second light-emitting unit 3212 in the other pixel layer. The image data of the third picture include enabling the light-emitting units with the coordinates of (2, 5), (2, 6), (3, 6), (4, 2), (4, 6), (5, 2), (5, 3), (5, 6), (6, 2), (6, 4), (6, 6), (7, 2), (7, 5), (7, 6), (8, 2), (8, 6), (9, 2), and (9, 3) to emit light. The image data of the third picture may be divided into the first part of image data and the second part of image data according to the distribution of the light-emitting units in the two pixel layers of the display panel, where the first part of image data includes enabling the light-emitting units with the coordinates of (2, 6), (4, 2), (4, 6), (5, 3), (6, 2), (6, 4), (6, 6), (7, 5), (8, 2), (8, 6) and (9, 3) to emit light, and the second part of image data includes enabling the light-emitting units with the coordinates of (2, 5), (3, 6), (5, 2), (5, 6), (7, 2), (7, 6), and (9, 2) to emit light.

Figure 18:
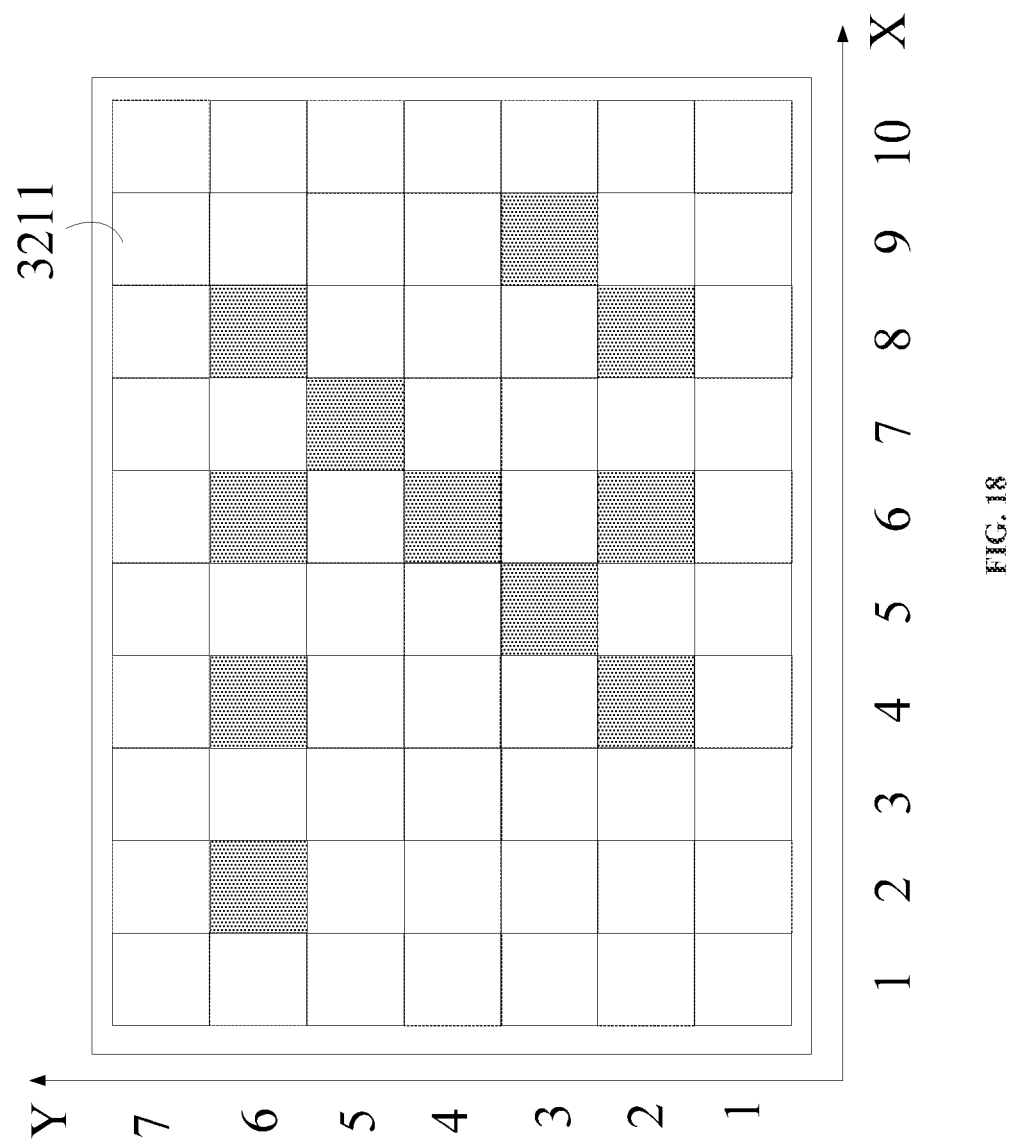
FIG. 18 is a schematic diagram of a display picture of a first pixel layer of a display panel according to an embodiment of the present disclosure.
Figure 19:
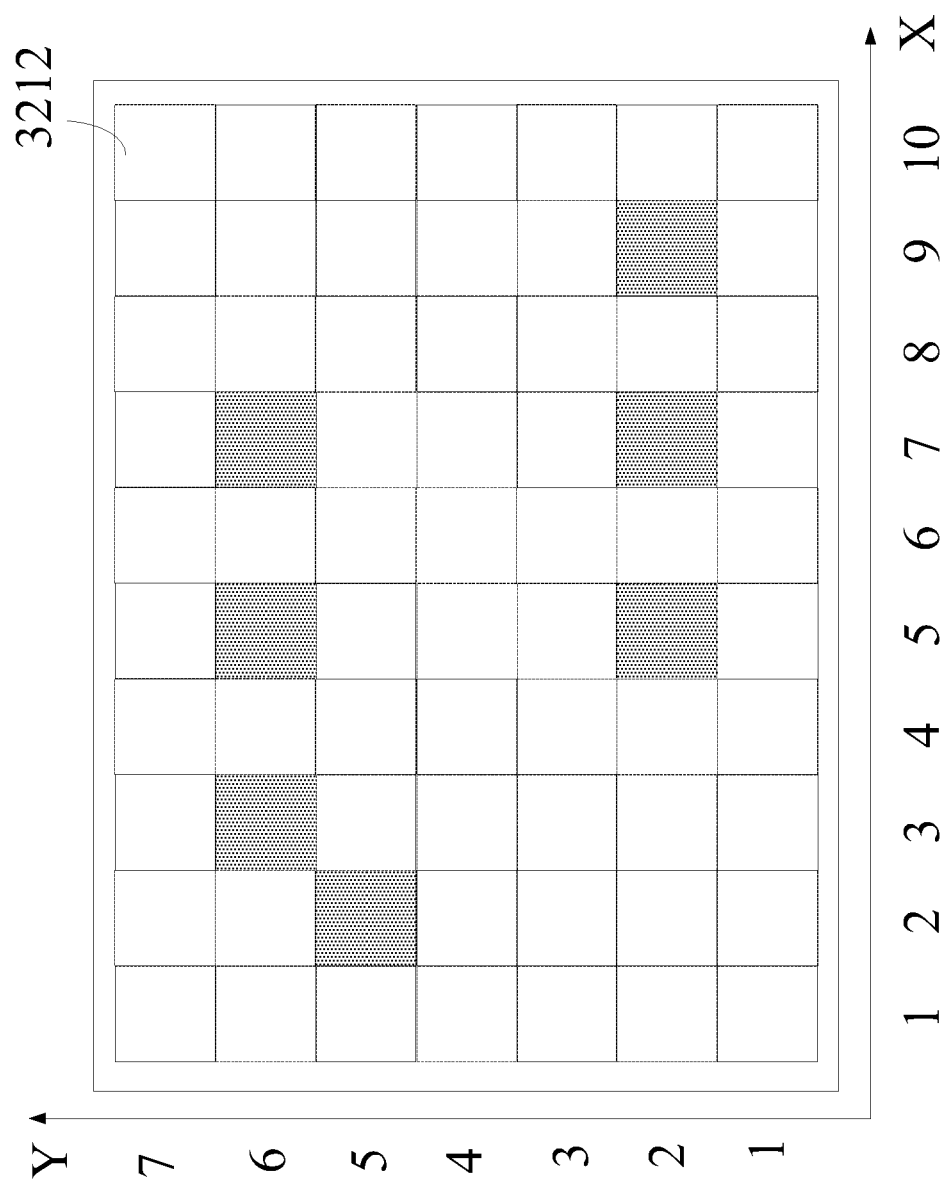
FIG. 19 is a schematic diagram of a display picture of a second pixel layer of a display panel according to an embodiment of the present disclosure.

FIG. 18 is a schematic diagram of a display picture of the first pixel layer according to an embodiment of the present disclosure, and FIG. 19 is a schematic diagram of a display picture of the second pixel layer according to an embodiment of the present disclosure. As shown in FIG. 18, the display panel, according to the first part of image data, controls the corresponding first light-emitting units 3211 on the first pixel layer to emit light, so that the first pixel layer displays the first part of the third image. As shown in FIG. 19, the display panel, according to the second part of image data, controls the corresponding second light-emitting units 3212 on the second pixel layer to emit light, so that the second pixel layer displays the second part of the third image. Since the light transmittance adjusting layer is in the light transmitting state at this point, the third picture shown in FIG. 17 can be observed on a side of the first pixel layer of the display pane. A mirror image of the third picture shown in FIG. 17 can be observed on a side of the second pixel layer of the display panel. Therefore, the first pixel layer and the second pixel layer are caused to jointly display the third picture.

The foregoing descriptions are merely exemplary embodiments of the present disclosure, and are not intended to limit the present disclosure. Within the spirit and principles of the disclosure, any modifications, equivalent substitutions, improvements, etc., shall fall into the protection scope of the present disclosure.

What is claimed is:

1. A display panel, comprising: a light transmittance adjusting layer and two pixel layers, wherein the two pixel layers are located on opposite surfaces of the light transmittance adjusting layer respectively, each of the pixel layers comprises a plurality of light-emitting units arranged in an array, each of the light-emitting units has two light-emitting surfaces, one of the two light-emitting surfaces faces the light transmittance adjusting layer, the other one of the two light-emitting surfaces is back to the light transmittance adjusting layer, and orthogonal projections of the two pixel layers on the light transmittance adjusting layer do not overlap.

2. The display panel according to claim 1, wherein each of the pixel layers comprises a plurality of rows of light-emitting units, each row of the light-emitting units extends in a first direction, the plurality of rows of light-emitting units of the two pixel layers are alternately arranged at intervals in a second direction, and the second direction is different from the first direction.

3. The display panel according to claim 1, wherein the plurality of light-emitting units of the two pixel layers are alternately disposed at intervals in the first direction and the second direction, and the second direction is different from the first direction.

4. The display panel according to claim 1, wherein each of the light-emitting units comprises a pixel unit.

5. The display panel according to claim 1, wherein the light transmittance adjusting layer is one of a liquid crystal cell and electrochromic glass.

6. The display panel according to claim 5, wherein the liquid crystal cell comprises two base substrates disposed opposite to each other in a cell-aligned manner, a liquid crystal layer, a liquid crystal control layer and two polarizers, the liquid crystal layer is sandwiched between the two base substrates, the liquid crystal control layer is disposed on at least one of the base substrates, the liquid crystal control layer is configured to control liquid crystal molecules in the liquid crystal layer to deflect, and the two base substrates are located between the two polarizers.

7. The display panel according to claim 6, wherein the liquid crystal control layer comprises two transparent control electrodes which are disposed respectively on a side of the two base substrates close to the liquid crystal layer, and each of the transparent control electrodes is a surface electrode.

8. The display panel according to claim 6, wherein the liquid crystal control layer comprises a plurality of strip-shaped transparent control electrodes disposed at intervals in parallel, the plurality of strip-shaped transparent control electrodes are disposed on the same base substrate, and the plurality of strip-shaped transparent electrodes are located on a side of the base substrate close to the liquid crystal layer.

9. The display panel according to claim 6, wherein a passivation layer is disposed between the liquid crystal control layer and the base substrate.

10. The display panel according to claim 1, wherein each light-emitting unit comprises at least one OLED light-emitting unit.

11. The display panel according to claim 10, wherein each OLED light-emitting unit comprises a first electrode and a second electrode, and an organic light-emitting structure sandwiched between the first electrode and the second electrode, and the first electrode and the second electrode are both transparent electrodes.

12. The display panel according to claim 1, wherein a transparent protective layer is disposed on a side of each of the pixel layers back to the light transmittance adjusting layer.

13. The display panel according to claim 1, further comprising: two source electrode driving units and two gate electrode driving units disposed in one-to-one correspondence with the two pixel layers.

14. A display device, comprising the display panel according to claim 1.

15. A method for manufacturing a display panel, comprising the following steps:
forming a pixel layer on a surface of a light transmittance adjusting layer; and
forming the other pixel layer on the other surface of the light transmittance adjusting layer;
wherein each of the pixel layers comprises a plurality of light-emitting units arranged in an array, each of the light-emitting units has two light-emitting surfaces, one of the two light-emitting surfaces faces the light transmittance adjusting layer, the other of the two light-emitting surfaces is back to the light transmittance adjusting layer, and orthogonal projections of the two pixel layers on the light transmittance adjusting layer do not overlap.

16. The manufacturing method according to claim 15, wherein the step of forming a pixel layer on the surface of the light transmittance adjusting layer comprises the following step:
making a plurality of light-emitting units in the pixel layer on a surface of the light transmittance adjusting layer, and
the step of forming the other pixel layer on the other surface of the light transmittance adjusting layer comprises the following step:
making a plurality of light-emitting units in the other pixel layer on the other surface of the light transmittance adjusting layer.

17. The manufacturing method according to claim 15, wherein the step of forming a pixel layer on the surface of the light transmittance adjusting layer comprises steps of:
making a pixel layer on a side surface of a first substrate; and
attaching the other side surface of the first substrate to the first surface of the light transmittance adjusting layer; and
the step of forming the other pixel layer on the other surface of the light transmittance adjusting layer comprises steps of:
making a pixel layer on one side surface of a second substrate; and
attaching the other side surface of the second substrate to the second surface of the light transmittance adjusting layer opposite to the first surface.

18. A method for driving a display panel, wherein the display panel comprises a light transmittance adjusting layer and two pixel layers which are located on opposite surfaces of the light transmittance adjusting layer respectively, each of the pixel layers comprises a plurality of light-emitting units arranged in an array, each of the light-emitting units has two light-emitting surfaces, one of the two light-emitting surfaces faces the light transmittance adjusting layer, the other one of the two light-emitting surfaces is back to the light transmittance adjusting layer, and orthogonal projections of the two pixel layers on the light transmittance adjusting layer do not overlap;
the driving method comprises steps of:
receiving a light transmittance control signal, and controlling the light transmittance adjusting layer to be in one of a non-light transmitting state and a light transmitting state according to the light transmittance control signal;
controlling one of the pixel layers to display a first picture, and controlling the other one of the pixel layers to display a second picture when the light transmittance adjusting layer is in the non-light transmitting state; and
controlling the two pixel layers to jointly display a third picture when the light transmittance adjusting layer is in the light transmitting state.

19. The driving method according to claim 18, wherein the step of controlling the two pixel layers to jointly display the third picture comprises steps of:
acquiring image data of the third picture;
dividing the image data of the third picture into a first part of image data and a second part of image data;
controlling one of pixel layers to display a first part of the third picture according to the first part of the image data; and
controlling the other one of the pixel layer to display a second part of the third picture according to the second part of the image data;
wherein the second part of the third picture is a part of the third picture other than the first part.

20. The driving method according to claim 18, further comprising the following steps:
receiving a double-sided display control signal; and
controlling selectively at least one of the two pixel layers to display a picture according to the double-sided display control signal.

* * * * *